United States Patent
Kim et al.

(10) Patent No.: US 8,634,265 B2
(45) Date of Patent: Jan. 21, 2014

(54) SEMICONDUCTOR MEMORY DEVICE AND METHOD FOR OPERATING THE SAME

(75) Inventors: Kwi-Dong Kim, Gyeonggi-do (KR);
Ki-Chang Kwean, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 127 days.

(21) Appl. No.: 12/814,702

(22) Filed: Jun. 14, 2010

(65) Prior Publication Data

US 2011/0235452 A1 Sep. 29, 2011

(30) Foreign Application Priority Data

Mar. 29, 2010 (KR) .................. 10-2010-0028074

(51) Int. Cl.
*G11C 17/18* (2006.01)
(52) U.S. Cl.
USPC ....................................... 365/225.7
(58) Field of Classification Search
USPC ..................................... 365/225.7
See application file for complete search history.

(56) References Cited

U.S. PATENT DOCUMENTS

| 2003/0094995 A1* | 5/2003 | Mori et al. | 327/525 |
| 2006/0171228 A1* | 8/2006 | Ueda | 365/225.7 |
| 2007/0253236 A1* | 11/2007 | Nakazawa | 365/96 |

FOREIGN PATENT DOCUMENTS

| KR | 100718901 | 5/2007 |
| KR | 1020080099976 | 11/2008 |

OTHER PUBLICATIONS

Notice of Preliminary Rejection issued from Korean Intellectual Property Office on May 30, 2011.

* cited by examiner

*Primary Examiner* — Anthan Tran
(74) *Attorney, Agent, or Firm* — IP & T Group LLP

(57) ABSTRACT

A semiconductor memory device including an information storage unit comprising a fuse configured to store information, a control unit configured to control a node of a blown fuse to become a floating state in response to a control pulse signal, and an output unit configured to output the information.

9 Claims, 5 Drawing Sheets

SEMICONDUCTOR MEMORY DEVICE AND METHOD FOR OPERATING THE SAME

CROSS-REFERENCE TO RELATED APPLICATIONS

The present application claims priority of Korean Patent Application No. 10-2010-0028074, filed on Mar. 29, 2010, which is incorporated herein by reference in its entirety.

BACKGROUND OF THE INVENTION

Exemplary embodiments of the present invention relate to a semiconductor design technology, and more particularly, to a semiconductor memory device including a fuse circuit which stores, for example, an address corresponding to a defective area of the memory device.

In general, a semiconductor memory device including a double data rate synchronous DRAM (DDR SDRAM) is provided with a large number of memory cells. As fabrication technologies have developed, the integration density of the semiconductor memory device gradually increases and the number of memory cells also gradually increases. When a fail occurs in an area of the memory device, for example, one of the memory cells, a corresponding semiconductor memory device may not perform a desired operation and thus may be discarded as a defective product.

As fabrication technologies for semiconductor memory devices have further developed, only a few memory cells may become defective. Here, if an entire semiconductor memory device is discarded as a defective product, the yield of products may suffer. Therefore, a redundancy memory cell may be provided within a semiconductor memory device. When a defect occurs in a normal memory cell, the defective memory cell may be replaced with the redundancy memory cell.

Meanwhile, a semiconductor memory device includes a fuse circuit which can store, for example, repair information. Methods for storing a fuse include an electrical cutting method and a laser cutting method. According to the electrical cutting method, a target fuse to be cut is melted and cut by applying an over-current to the target fuse. According to the laser cutting method, a target fuse to be cut is blown by a laser beam. In general, since the laser cutting method is simpler than the electrical cutting method, the former is widely used.

As described above, the address corresponding to the memory cell to be replaced may be stored in the fuse circuit, and the semiconductor memory device may be repaired by the fuse circuit.

FIG. 1 is a circuit diagram illustrating a fuse circuit of a conventional semiconductor memory device.

Referring to FIG. 1, the fuse circuit according to an example includes storage units 110, a precharge unit 120, and an output unit 130.

The plurality of storage units 110 may include a plurality of fuses for storing addresses corresponding to memory cells to be replaced, and output information of the replacement stored in the fuses to a first node N_B in response to a plurality of selection signals XMAT<0:N> (where N is a natural number). The plurality of selection signals XMAT<0:N> may be signals corresponding to a region activated among a plurality of memory cell arrays in response to an active command and an address. The plurality of selection signals XMAT<0:N> may be inputted to corresponding transistors.

For convenience, a storage unit 111 among the storage units 110 will be described below.

The storage unit 111 may include a fuse F and an NMOS transistor NM coupled between a second node N_C and a ground voltage (VSS) terminal. The NMOS transistor NM is configured to be turned on/off in response to a zeroth selection signal XMAT<0> which is one of the plurality of selection signals XMAT<0:N>. When the NMOS transistor NM is turned on, the voltage levels of the first and second nodes N_B and N_C may be determined according to whether the fuse F is cut or not. A detailed description thereof will be provided later with reference to FIG. 2.

Meanwhile, the precharge unit 120 is configured to precharge the first node N_B to a power supply voltage VDD in response to a precharge signal WLCB. The output unit 130 is configured to output information, for example, a repair information, and an information output RADD may have a logic level corresponding to the voltage level of the output node N_A.

FIG. 2 is a waveform diagram explaining the operation of the fuse circuit of FIG. 1. For convenience, the storage unit 111 among the plurality of storage units 110 will be described representatively.

Referring to FIGS. 1 and 2, the first node N_B may be precharged to the power supply voltage VDD in response to the precharge signal WLCB which maintains a logic low level prior to an active operation. At this time, the voltage level of the second node N_C between the fuse F and the NMOS transistor NM may be determined according to whether the fuse F is cut or not. That is, if the fuse F is not cut, the second node N_C may have the same voltage level as that of the first node N_B. If the fuse F is cut, the second node N_C becomes a floating state.

After the active operation, when the precharge signal WLCB changes from a logic low level to a logic high level and the zeroth selection signal XMAT<0> changes from a logic low level to a logic high level, the voltage levels of the first and second nodes N_B and N_C may be determined according to whether the fuse F is cut or not. That is, if the fuse F is not cut, the first node N_B may become a logic low state corresponding to the ground voltage VSS, and the second node N_C may have the same voltage level as that of the first node N_B. If the fuse F is cut, the first node N_B may become a logic high state corresponding to the power supply voltage VDD, and the second node N_B may become a logic low state corresponding to the ground voltage VSS. The repair information output RADD becomes a logic high state if the fuse F is cut, and becomes a logic low state if the fuse F is not cut.

Meanwhile, as fabrication technologies for semiconductor memory devices advance, the size of the fuse becomes smaller and a cut region of the fuse becomes smaller. The reduction in the cut region of the fuse means that a fuse may easily change to an uncut state for various reasons. For example, such change may be caused by an electric field generated by a voltage difference between both terminals of a cut fuse. Consequently, the cut fuse may operate as an uncut fuse and a circuit including such a fuse may malfunction.

A case in which a fail occurs in a fuse will be described in more detail with reference to FIGS. 1 and 2. For convenience, a case in which the fuse F is cut will be described below.

If the fuse F of FIG. 1 is cut, the first node N_B and the second node N_C may have different voltage levels as illustrated in FIG. 2. That is, if the zeroth selection signal XMAT<0> is at a logic high level, the first node N_B may become a logic high state corresponding to the power supply voltage VDD, and the second node N_C may become a logic low state corresponding to the ground voltage VSS. In this case, a voltage difference may be maintained between both terminals of the fuse F. Thus, reconnection of the cut fuse may occur. Consequently, even though the fuse F is cut, the fuse F may become an uncut state due to the voltage difference between both terminals of the fuse F and thus the fuse fail may occur.

SUMMARY OF THE INVENTION

An embodiment of the present invention is directed to a semiconductor memory device which is capable of controlling a voltage across a fuse during a circuit operation.

In accordance with an embodiment of the present invention, a semiconductor memory device includes: an information storage unit comprising a fuse configured to program information; a control unit configured to control a node of a blown fuse to become a floating state in response to a control pulse signal; and an output unit configured to output the information.

In accordance with another embodiment of the present invention, a semiconductor memory device includes: an information storage unit comprising a fuse configured to program information; a voltage driving unit configured to control a first node of a blown fuse to have at least substantially the same voltage level as a second node of the blown fuse in response to a control pulse signal; and an output unit configured to output the information.

In accordance with yet another embodiment of the present invention, a method for operating a semiconductor memory device includes: outputting information stored in a fuse to an output unit in response to a selection signal; and changing a voltage level of a node of the fuse to reduce a difference of the voltage level of the node with a voltage level of another node of the fuse.

In accordance with the embodiments of the present invention, the fuse circuit may reduce malfunctions of the fuse circuit by controlling a voltage level of a terminal of the fuse during the circuit operation.

DESCRIPTION OF SPECIFIC EMBODIMENTS

Figure 1:
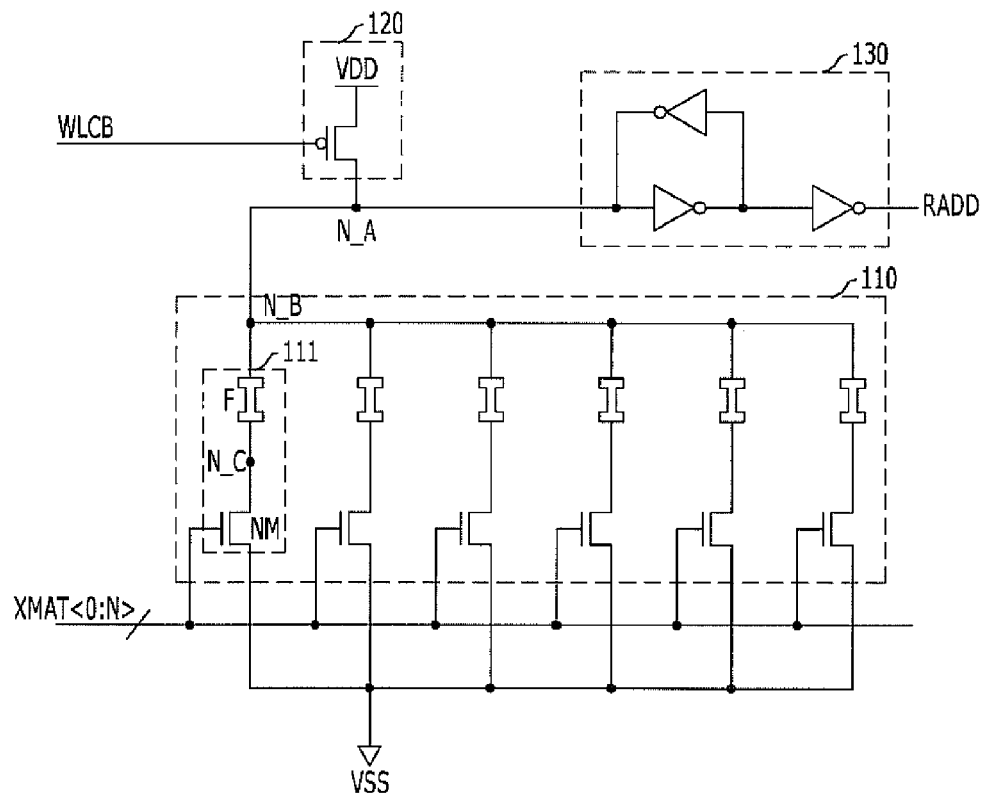
FIG. 1 is a circuit diagram illustrating a fuse circuit of a conventional semiconductor memory device.
Figure 2:
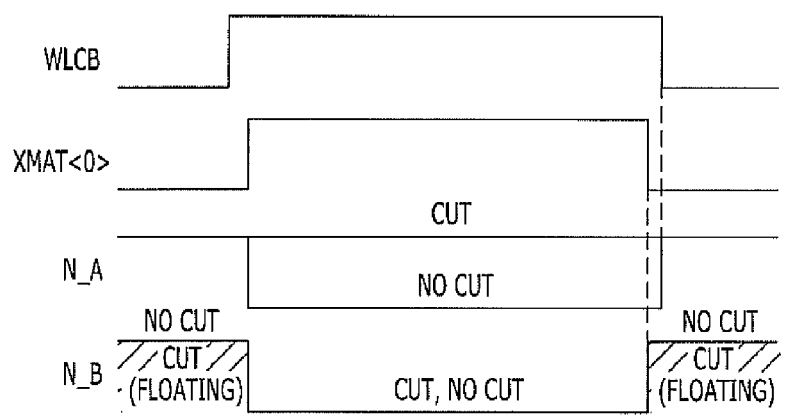
FIG. 2 is a waveform diagram explaining an operation of the fuse circuit of FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
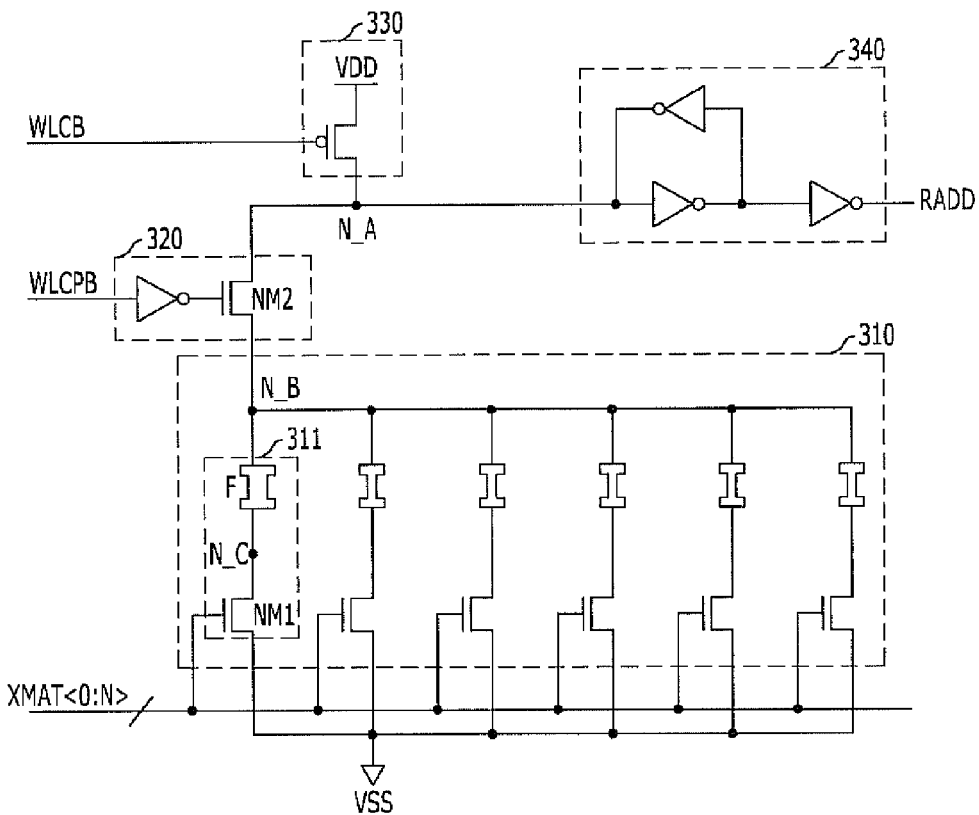
FIG. 3 is a circuit diagram illustrating a fuse circuit of a semiconductor memory device in accordance with an embodiment of the present invention.

FIG. 3 is a circuit diagram illustrating a fuse circuit of a semiconductor memory device in accordance with an embodiment of the present invention.

Referring to FIG. 3, the fuse circuit may include a plurality of storage units 310, a control unit 320, a precharge unit 330, and an output unit 340.

The plurality of storage units 310 may include a plurality of fuses configured to store information, and output the information stored in fuses through a first node N_B being a common node of plurality of fuses to an output node N_A in response to a plurality of selection signals XMAT<0:N> (where N is a natural number). The plurality of selection signals XMAT<0:N> may be signals corresponding to a region activated among a plurality of memory cell arrays in response to an active command and an address. The plurality of selection signals XMAT<0:N> may be inputted to corresponding transistors.

For convenience, a storage unit 311 among the plurality of storage units 310 will be described below.

The storage unit 311 may include a fuse F and a first NMOS transistor NM1 coupled between the first node N_B and a ground voltage (VSS) terminal. The first NMOS transistor NM1 may function to activate the fuse F. The first NMOS transistor NM1 is configured to be turned on/off in response to a zeroth selection signal XMAT<0> which is one of the plurality of selection signals XMAT<0:N>. If the first NMOS transistor NM1 is turned on, the voltage levels of the first node N_B and second node N_C may be determined according to whether the fuse F is cut or not. A detailed description thereof will be provided later with reference to FIG. 4.

Meanwhile, the control unit 320 is configured to control a node of the fuse F to become a floating state in response to a control pulse signal WLCPB. The control unit 320 may include a second NMOS transistor NM2. The control pulse signal WLCPB may be inactivated to a logic low level before an activation of the selection signals XMAT<0:N>, and activated to a logic high level after a predetermined time from the activation of the selection signals XMAT<0:N>. Accordingly, the second NMOS transistor NM2 may couple the first node N_B to the output node N_A or separate the first node N_B from the output node N_A in response to the control pulse signal WLCPB.

The precharge unit 330 is configured to precharge the output node N_A to a power supply voltage VDD having a preset level in response to the precharge signal WLCB. The output unit 340 is configured to output an information output RADD having a logic level corresponding to the voltage level of the output node N_A.

Figure 4:
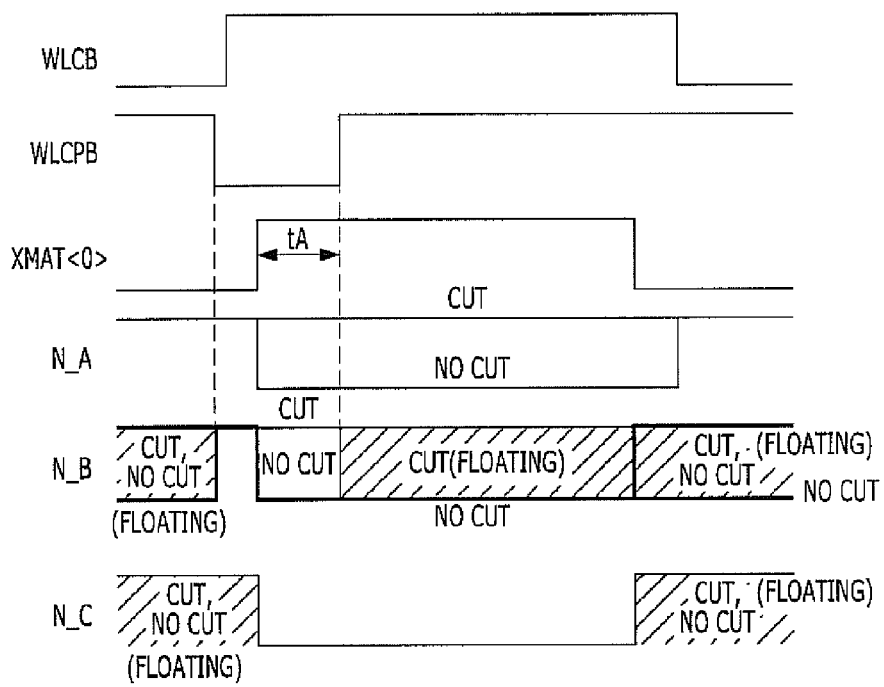
FIG. 4 is a waveform diagram explaining an operation of the fuse circuit of FIG. 3 in accordance with an embodiment of the present invention.

FIG. 4 is a waveform diagram explaining the operation of the fuse circuit of FIG. 3 in accordance with the first embodiment of the present invention. For convenience, the storage unit 311 among the plurality of storage units 310 will be described representatively.

Referring to FIGS. 3 and 4, the output node N_A may be precharged to the power supply voltage VDD in response to the precharge signal WLCB which may maintain a logic low level prior to an active operation. At this time, the second NMOS transistor NM2 may be turned off in response to the control pulse signal WLCPB of a logic high level, and the first NMOS transistor NM1 may be turned off in response to the zeroth selection signal XMAT<0> of a logic low level. Therefore, the first node N_B and the second node N_C may become a floating state. That is, if the fuse F is not cut, the first node N_B and the second node N_C become a floating state having the same voltage level. Also, if the fuse F is cut, both of the first node N_B and the second node N_C become a floating state.

Subsequently, the control pulse signal WLCPB may be changed from a logic high level to a logic low level so that the second NMOS transistor NM2 is turned on, and the zeroth selection signal XMAT<0> may be changed from a logic low level to a logic high level so that the first NMOS transistor NM1 is turned on. In this case, the voltage levels of the output node N_A, the first node N_B and the second node N_C may be determined according to whether the fuse F is cut or not. That is, if the fuse F is not cut, the output node N_A and the first node N_B may become a logic low state, and the second node N_C also becomes a logic low state. On the other hand, if the fuse F is cut, the output node N_A and the first node N_B may become a logic high state, and the second node N_C becomes a logic low state.

Meanwhile, the control pulse signal WLCPB may have a pulse width corresponding to a preset time tA in response to the precharge signal WLCB. In order to have a more stable operation, it is illustrated that the pulse width of the control pulse signal WLCPB is longer than the preset time tA. The preset time tA corresponds to time at which the voltage level of the output node N_A can be determined according to whether the fuse F is cut or not. Therefore, the second NMOS transistor NM2 may be turned off in response to the control pulse signal WLCPB which changes from a logic low level to a logic high level after the preset time tA.

After the second NMOS transistor NM2 is turned off, the voltage levels of the first node N_B and the second node N_C are determined according to whether the fuse F is cut or not. That is, if the fuse F is not cut, the first node N_B may become a logic low state, and the second node N_C also may become a logic low state. On the other hand, if the fuse F is cut, the first node N_B may become a floating state, and the second node N_C may become a logic low state. At this time, since the output node N_A may be separated from the first node N_B, it can maintain a voltage level corresponding to whether the fuse F is cut or not.

Therefore, the fuse circuit in accordance with the first embodiment of the present invention can minimize/reduce the voltage level difference between both terminals of the cut fuse F because it may separate the output node N_A from the first node N_B after outputting the information stored in the fuse F to the output node N_A. That is, if the fuse F is cut, the first node N_B may become a floating state, and the second node N_C may become a logic low state. Hence, a probability of reconnection of the cut fuse may decrease because both terminal of the fuse have a floating state and a logic low level.

Figure 5:
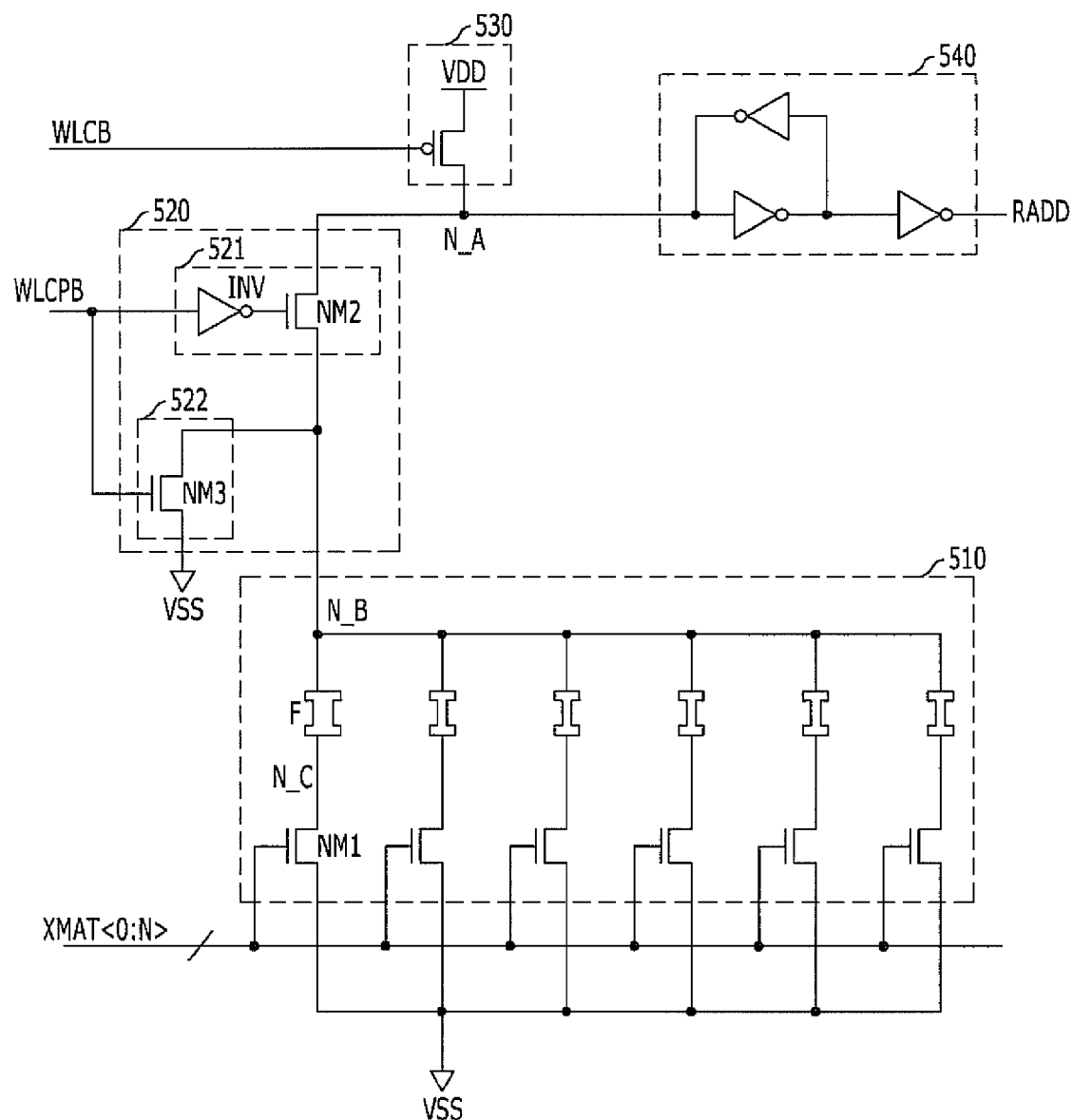
FIG. 5 is a circuit diagram illustrating a fuse circuit of a semiconductor memory device in accordance with another embodiment of the present invention.

FIG. 5 is a circuit diagram illustrating a fuse circuit of a semiconductor memory device in accordance with another embodiment of the present invention.

Referring to FIG. 5, the fuse circuit may include a plurality of storage units 510, a voltage driving unit 520, a precharge unit 530, and an output unit 540. Since the plurality of storage units 510, the precharge unit 530, and the output unit 540 may have circuit configurations and operations substantially identical to those of the fuse circuit of FIG. 3 in accordance with the previously described embodiment of the present invention, detailed description for this embodiment will be omitted.

The voltage driving unit 520 may include a separation/connection section 521 and a driving section 522 and is configured to separate a output node N_A from a first node N_B in response to a control pulse signal WLCPB which may be activated to a logic high level after an activation timing of a plurality of selection signals XMAT<0:N>, and to drive a first node N_B to a ground voltage VSS.

The separation/connection section 521 is configured to connect the output node N_A to the first node N_B or separate the output node N_A from the first node N_B in response to the control pulse signal WLCPB. The separation/connection section 521 may include an inverter INV configured to invert the control pulse signal WLCPB, and a second NMOS transistor NM2 configured to couple or separate the output node N_A and the first node N_B in response to the control pulse signal WLCPB.

The driving section 522 is configured to drive the first node N_B to the ground voltage VSS in response to the control pulse signal WLCPB. The driving section 522 may include a third NMOS transistor NM3 configured to form a path between the first node N_B and a ground voltage (VSS) terminal in response to the control pulse signal WLCPB.

As will be again described later, the separation/connection section 521 may couple the output node N_A to the first node N_B during a duration corresponding to a pulse width of the control pulse signal WLCPB, and then separate the output node N_A from the first node N_B. At the timing when the output node N_A and the first node N_B are separated from each other, the driving section 522 may operate to drive the first node N_B to the ground voltage VSS.

Figure 6:
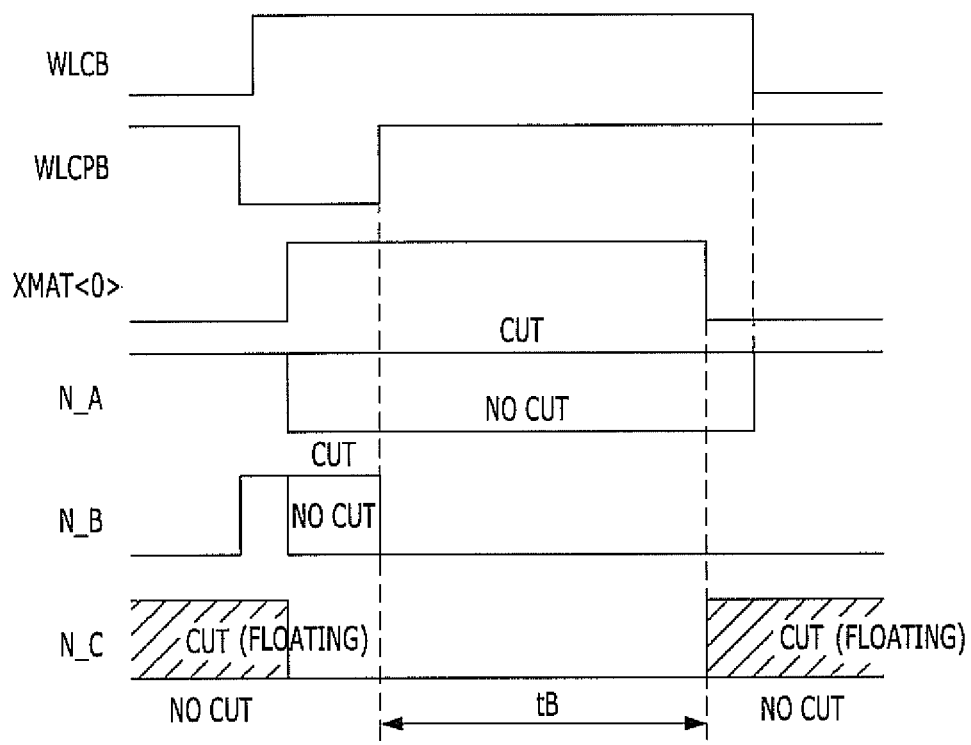
FIG. 6 is a waveform diagram explaining an operation of the fuse circuit of FIG. 5 in accordance with another embodiment of the present invention.

FIG. 6 is a waveform diagram explaining an operation of the fuse circuit of FIG. 5 in accordance with another embodiment of the present invention.

Referring to FIGS. 5 and 6, since the second NMOS transistor NM2 may be turned off and the third NMOS transistor NM3 may be turned on during a duration in which the precharge signal WLCB is at a logic low and the control pulse signal WLCPB is at a logic high level, the first node N_B may become a logic low state corresponding to the ground voltage VSS. In this case, the second node N_C may become a logic low state if the fuse F is not cut, and become a floating state if the fuse F is cut.

Subsequently, when the control pulse signal WLCPB may be changed from a logic high level to a logic low level so that the second NMOS transistor NM2 and the third NMOS transistor NM3 are turned on and turned off, respectively, and the zeroth selection signal XMAT<0> may be changed from a logic low level to a logic high level so that the first NMOS transistor NM1 is turned on, the voltage levels of the output node N_A, the first node N_B, and the second node N_C are determined according to whether the fuse F is cut or not. That is, if the fuse F is not cut, the output node N_A and the first node N_B may become a logic low state, and the second node N_C also may become a logic low level. When the fuse F is cut, the output node N_A and the first node N_B may become a logic high level, and the second node N_C may become a logic low level.

Subsequently, if the control pulse signal WLCPB changes from a logic low level to a logic high level so that the second NMOS transistor NM2 and the third NMOS transistor NM3 are turned off and turned on, respectively, the first node N_B and the second node N_C may become a logic low state, regardless of whether the fuse F is cut or not. That is, both terminals of the fuse F may have the same voltage level.

Therefore, the fuse circuit in accordance with this embodiment of the present invention may maintain both terminals of the fuse F in a logic low state because the output node N_A may be separated from the first node N_B after the address stored in the fuse F may be outputted, and the first node N_B is driven to the ground voltage VSS. As apparent from the comparison of the waveform diagrams illustrated in FIGS. 4 and 6, in the case of this embodiment, both terminals of the fuse F may maintain the same state, specifically a logic low state, from a timing when the control pulse signal WLCPB changes to a logic high level to a timing tB when the zeroth selection signal XMAT<0> changes to a logic low level. Thus, a probability of reconnection of the cut fuse may decrease because both terminal of the fuse have, for example, a logic low level.

Figure 7:
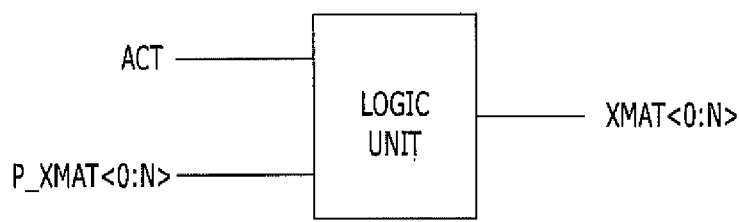
FIG. 7 is a circuit diagram illustrating a logic unit configured to generate a selection signal in response to an active signal and a pre-selection signals.

FIG. 7 is a circuit diagram illustrating a logic unit configured to generate a selection signal in response to an active signal ACT and a pre-selection signals P_XMAT<0:N>.

Figure 8:
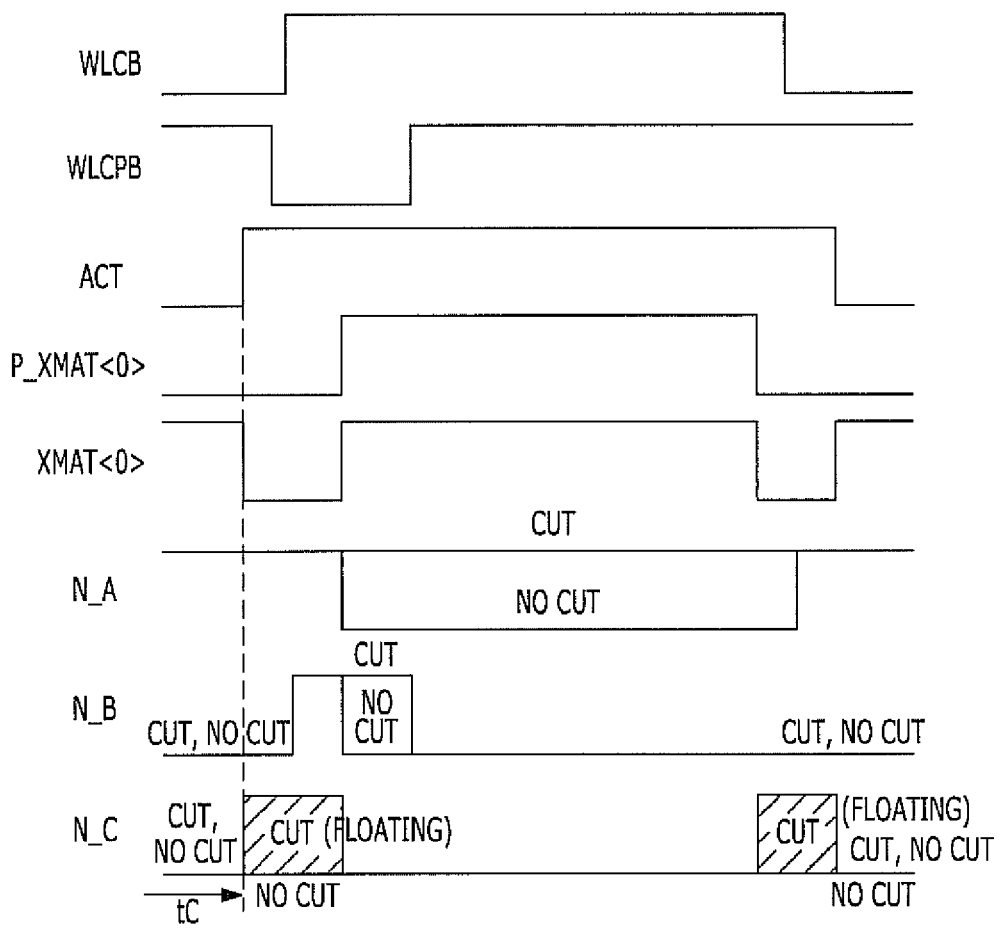
FIG. 8 is a waveform diagram explaining another operation of the fuse circuit of FIG. 5 in accordance with another embodiment of the present invention.

FIG. 8 is a waveform diagram explaining another operation of the fuse circuit of FIG. 5 in accordance with another embodiment of the present invention.

Compared with FIG. 6, an active signal ACT and a pre-selection signal P_XMAT<0> are additionally illustrated in FIG. 8. Thus, the waveform of the selection signal XMAT<0> is changed. The active signal ACT may be a signal activated in the active operation of the semiconductor memory device, and the pre-selection signal P_XMAT<0> may correspond to the selection signal XMAT<0>. The selection signal XMAT<0> of FIG. 8 may be a signal generated by a logic combination of the active signal ACT and the pre-selection signal P_XMAT<0>, and may be inputted to the storage units 510 of FIG. 5.

Referring to FIGS. 5 to 8, the selection signal XMAT<0> of FIG. 6 may maintain a logic low level until the information stored in the fuse F is outputted to the output node N_A. However, the selection signal XMAT<0> of FIG. 8 generated by the logic combination of the active signal ACT and the pre-selection signal P_XMAT<0> may maintain a logic high level prior to the active operation, that is, during a duration tC in which the active signal ACT maintains a logic low level. Therefore, the first NMOS transistor NM1 of the storage unit 510 which receives the selection signal XMAT<0> of FIG. 8 may be turned on during this duration tC.

In other words, during the duration tC, the first NMOS transistor NM1 may be turned on, the second NMOS transistor NM2 may be turned off, and the third NMOS transistor NM3 may be turned on. Therefore, the output node N_A may be precharged to the power supply voltage VDD, and the first node N_B and the second node N_C are driven to the ground voltage VSS. That is, during the duration tC, both terminals of the fuse F, that is, the first node N_B and the second node N_C, may maintain the same state, specifically a logic low state.

Consequently, in comparison of FIGS. 6 and 8, if the fuse F is cut, the first node N_B may become a logic low state, and the second node N_C may become a floating state prior to the active operation of FIG. 6. Even in such a state, a probability of reconnection of the cut fuse may decrease. Also, if the first node N_B and the second node N_C maintain the same state through the circuit operation of FIG. 8, a probability of reconnection of the cut fuse may also decrease.

While the present invention has been described with respect to the specific embodiments, it will be apparent to those skilled in the art that various changes and modifications may be made without departing from the spirit and scope of the invention as defined in the following claims.

Moreover, the positions and types of the logic gates and transistors exemplarily set forth above may be differently implemented depending on the polarities of the input signals.

What is claimed is:

1. A semiconductor memory device comprising:
an information storage unit comprising a fuse configured to store information;
a control unit configured to control a voltage level of a first node of the fuse to reduce a difference between the voltage level of the first node and a voltage level of a second node of the fuse; and
an output unit configured to output a signal at an output node,
wherein the information stored in the fuse is outputted in response to an activation of a selection signal, and the control unit is connected between the first node of the fuse and the output node so as to electrically separate the information storage unit from the output unit in response to a control pulse signal which is activated after a given time from the activation of the selection signal.

2. The semiconductor memory device of claim 1, wherein the control unit is configured to control the first node of the fuse to be in a floating state by electrically separating the information storage unit from the output unit in response to the control pulse signal.

3. The semiconductor memory device of claim 1, wherein the control unit is configured to electrically connect the information storage unit to the output unit while the selection signal becomes activated, and to electrically separate the information storage unit from the output unit after the selection signal becomes activated.

4. The semiconductor memory device of claim 1, wherein the control pulse signal has a pulse width corresponding to a set time taken to transfer the information stored in the fuse to the first node.

5. The semiconductor memory device of claim 1, further comprising a precharge unit configured to precharge the output node to a set level in response to a precharge signal.

6. The semiconductor memory device of claim 1, wherein the selection signal is activated according to row address information during an active operation.

7. The semiconductor memory device of claim 1, wherein the control unit is configured to control the first node of the fuse to have at least the substantially same voltage level as the second node of the fuse in response to the control pulse signal.

8. The semiconductor memory device of claim 7, wherein the control unit is configured to electrically separate the first node from the output unit and drive the first node to a voltage level of a voltage source coupled to the second node of the fuse.

9. The semiconductor memory device of claim 7, wherein the control unit comprises:
a separation/connection section configured to connect the first node to the output unit or separate the first node from the output unit in response to the control pulse signal; and
a driving section configured to drive the first node to a voltage level of a voltage source coupled to the second node of the fuse.

* * * * *